(12) United States Patent
DeAngelis et al.

(10) Patent No.: US 6,346,491 B1
(45) Date of Patent: Feb. 12, 2002

(54) FELT HAVING CONDUCTIVITY GRADIENT

(75) Inventors: Alfred R. DeAngelis; Andrew D. Child, both of Spartanburg, SC (US)

(73) Assignee: Milliken & Company, Spartanburg, SC (US)

( * ) Notice: Subject to any disclaimer, the term of this patent is extended or adjusted under 35 U.S.C. 154(b) by 0 days.

(21) Appl. No.: 09/321,927

(22) Filed: May 28, 1999

(51) Int. Cl.[7] .......................... B32B 27/04; B32B 27/12; B32B 5/26
(52) U.S. Cl. .................. 442/110; 442/239; 442/240; 442/301; 442/304; 442/318; 442/320
(58) Field of Search ................................. 442/110, 304, 442/316, 318, 320, 321, 322, 323, 324, 325, 326, 301, 228, 239, 240

(56) References Cited

U.S. PATENT DOCUMENTS

| | | | |
|---|---|---|---|
| 4,803,096 A | 2/1989 | Kuhn et al. | 427/121 |
| 4,877,646 A | 10/1989 | Kuhn et al. | 427/121 |
| 4,975,317 A | 12/1990 | Kuhn et al. | 428/253 |
| 4,981,718 A | 1/1991 | Kuhn et al. | 427/121 |
| 5,102,727 A | 4/1992 | Pittman et al. | 428/259 |
| 5,108,829 A | 4/1992 | Kuhn | 428/253 |
| 5,316,830 A * | 5/1994 | Adams, Jr. et al. | 428/195 |
| H1523 H | 4/1996 | Mammone et al. | 264/104 |
| 5,624,736 A * | 4/1997 | DeAngelis et al. | 428/196 |
| 5,821,454 A | 10/1998 | Babb et al. | 174/35 TS |
| 5,833,884 A | 11/1998 | Child | 252/500 |

* cited by examiner

Primary Examiner—Timothy J. Monahan
Assistant Examiner—Ula C. Ruddock
(74) Attorney, Agent, or Firm—Terry T. Moyer; Timothy J. Monahan

(57) ABSTRACT

The present invention relates to an electromagnetically conductive textile fabric comprising conductive fibers arranged to provide a conductivity gradient through its thickness. The fibers may be intrinsically conductive or coated with a conducting material and the gradient can be related to variances in fiber density, fiber diameter (fineness) and fiber conductivity. The fabric can be used to eliminate or reduce electromagnetic interference (EMI) in various applications.

26 Claims, 5 Drawing Sheets

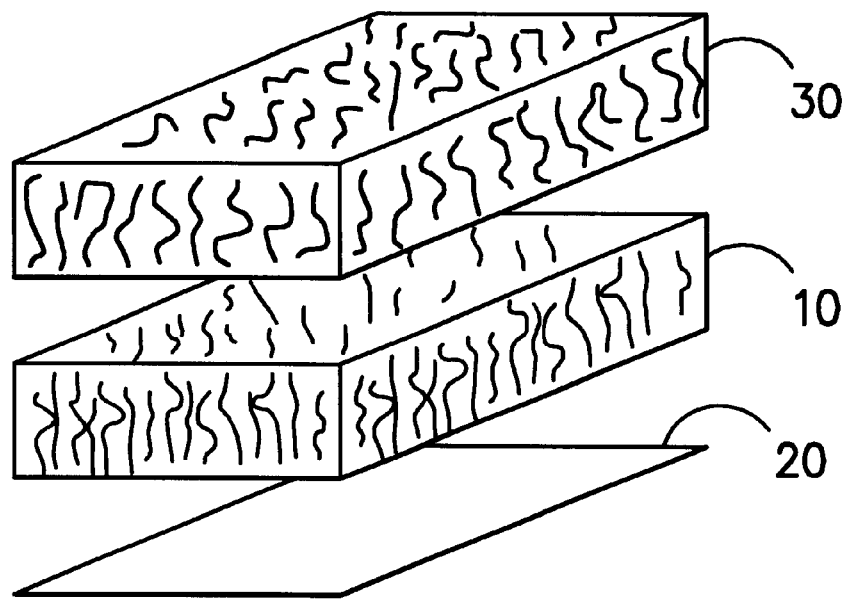
FIG. -1-
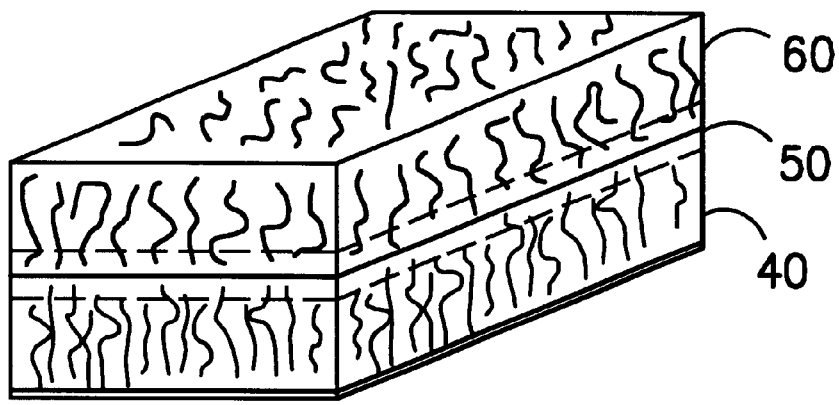
FIG. -2-

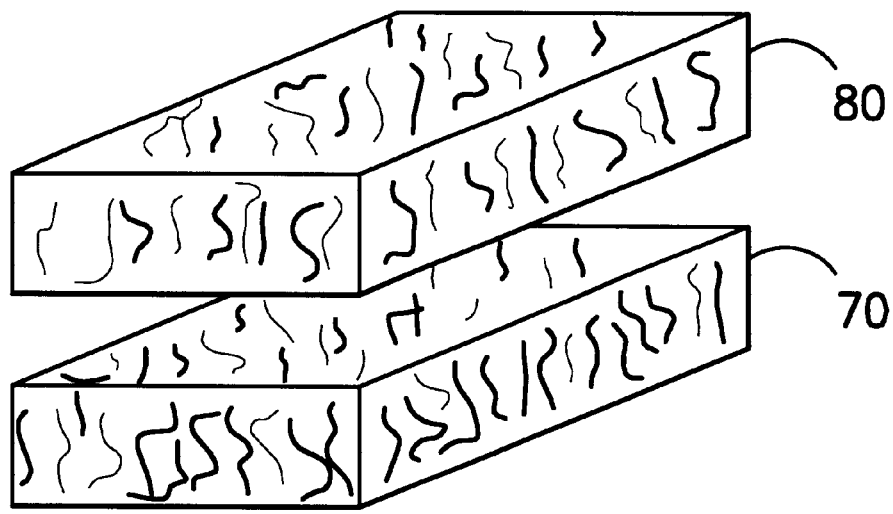
FIG. -3-
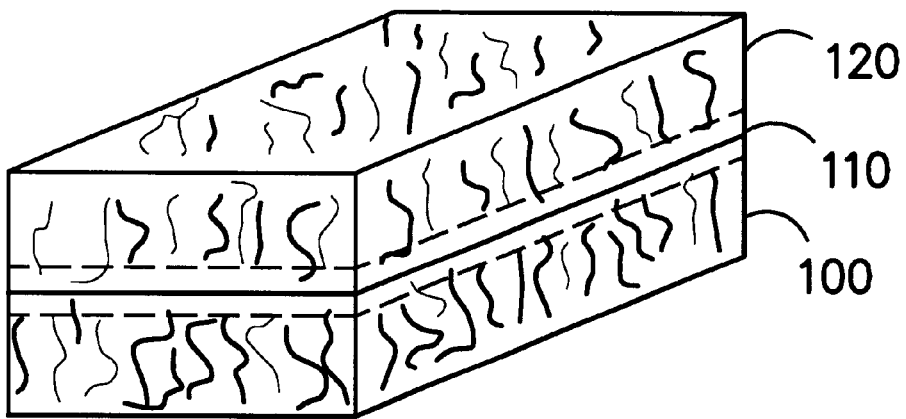
FIG. -4-

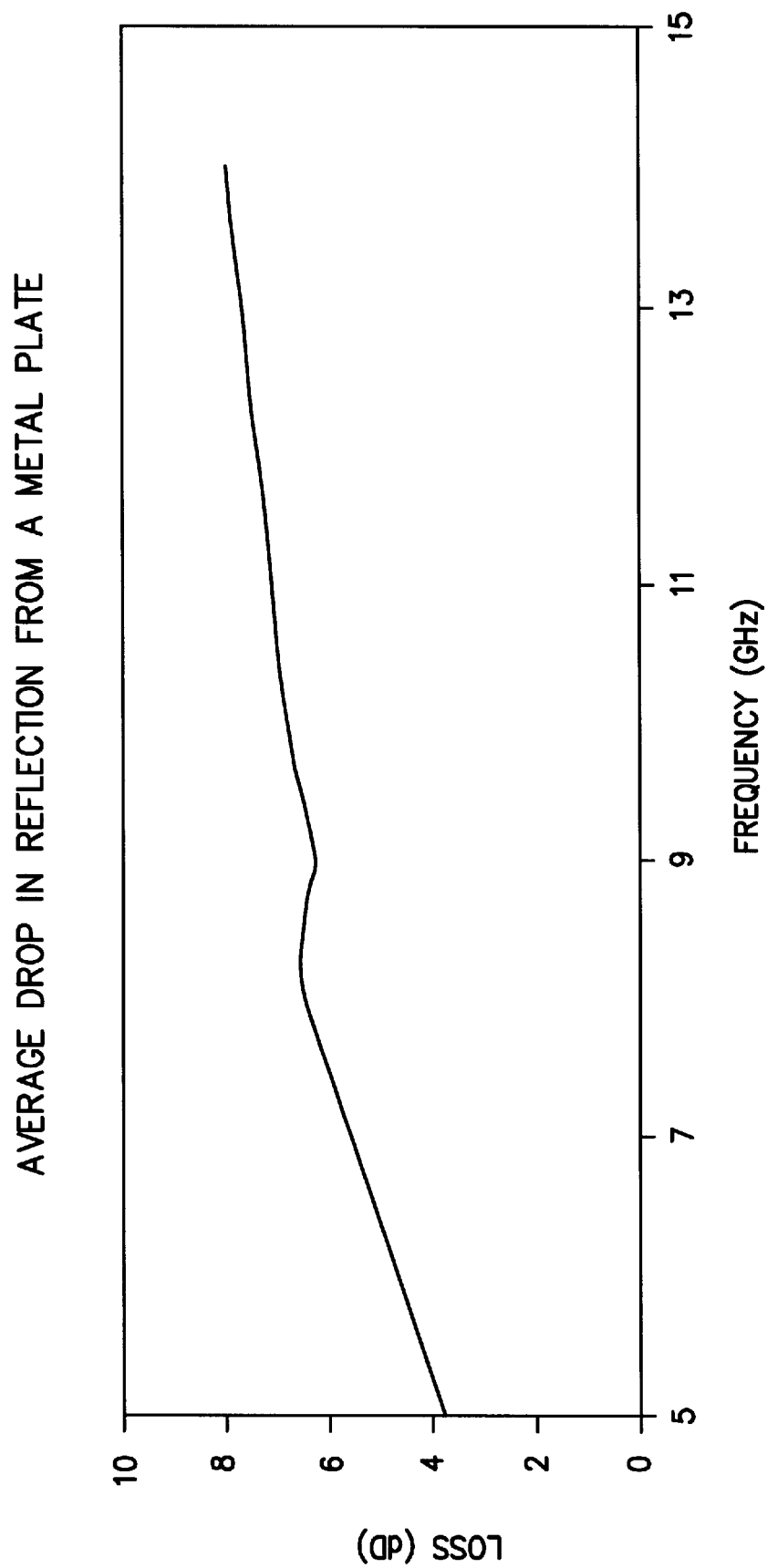
FIG. -5-

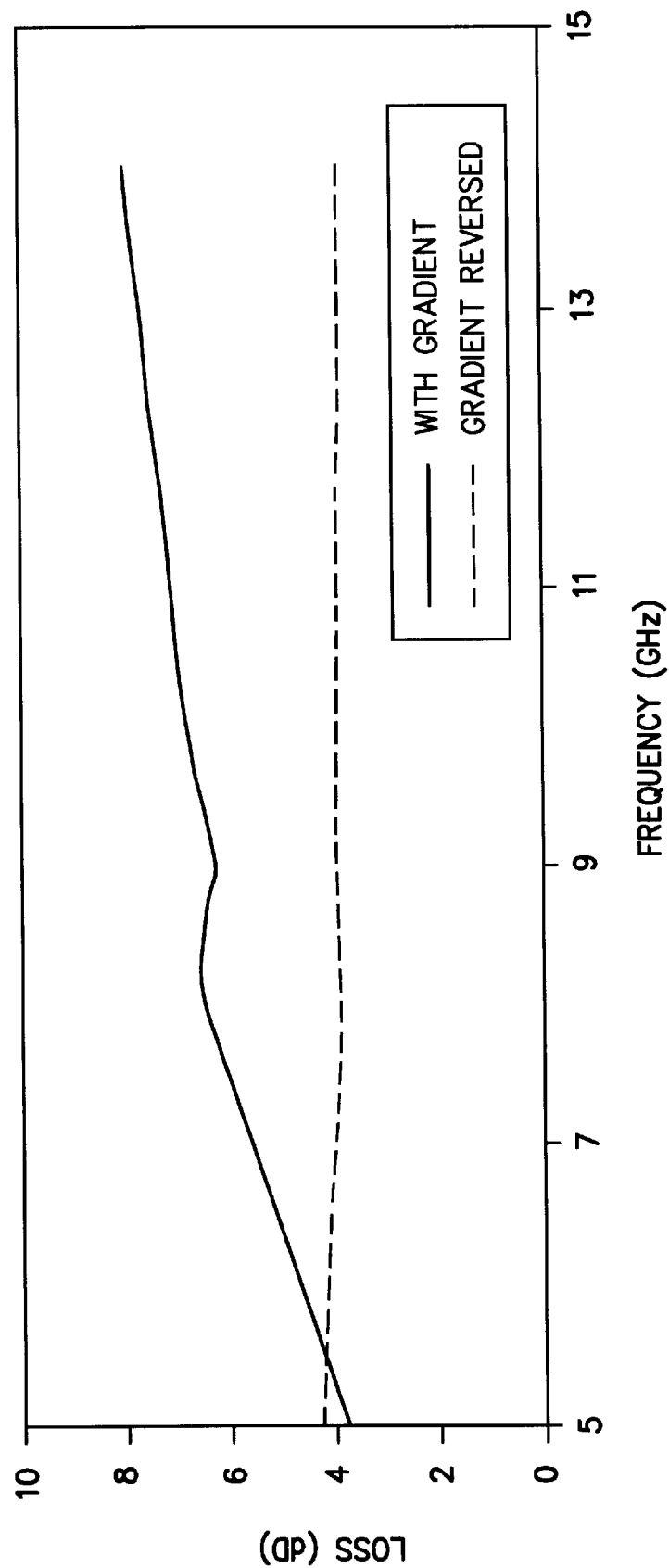
FIG. -6-

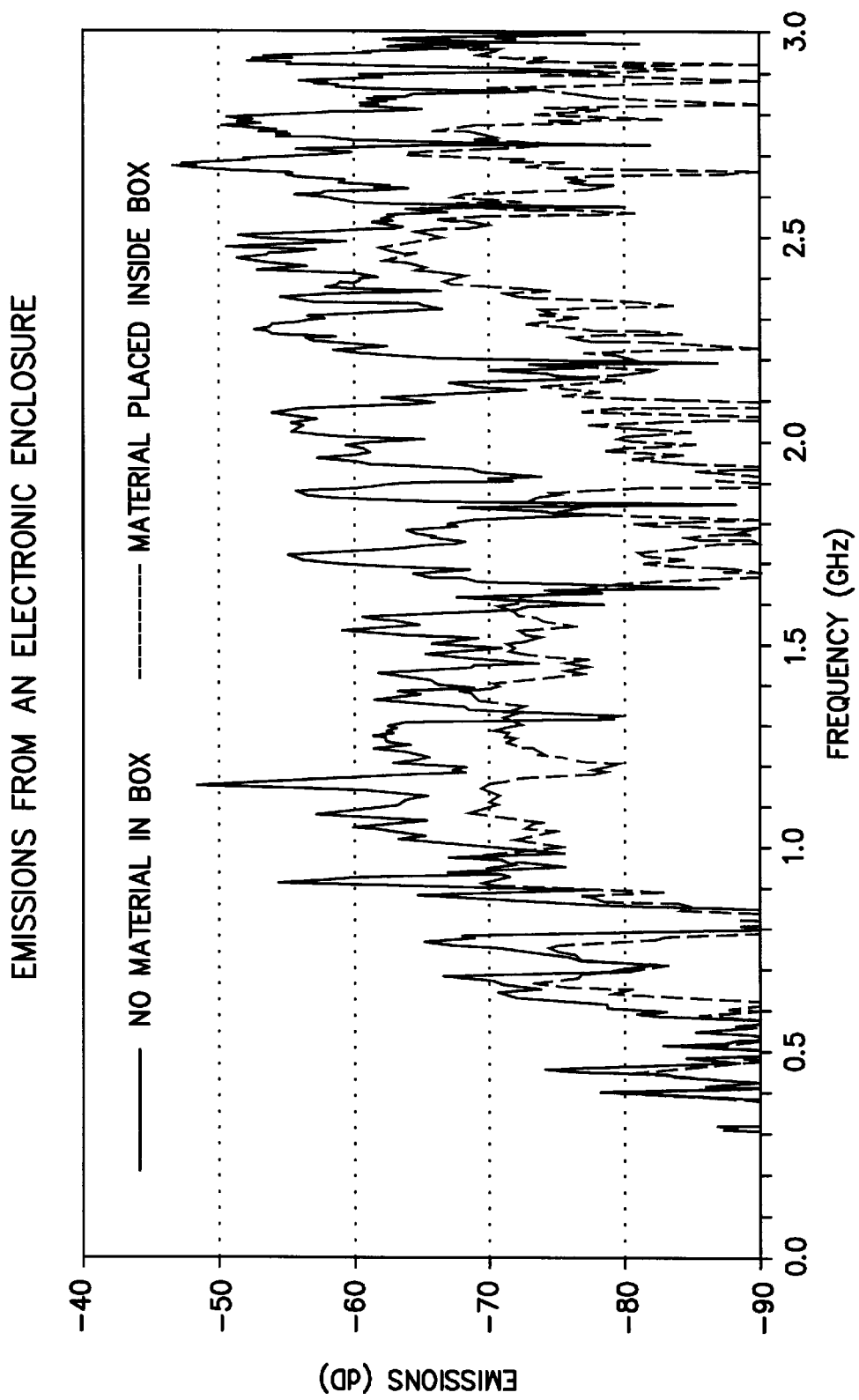
FIG. -7-

FELT HAVING CONDUCTIVITY GRADIENT

BACKGROUND OF THE INVENTION

This invention relates to a three-dimensional, conductive felt fabric having an electromagnetic conductivity gradient through its thickness. The present invention also relates to a method for producing such fabrics and their use as broadband microwave absorbers.

Electrically conductive fabrics have, in general, been known for some time. Such fabrics have been manufactured by mixing or blending a conductive powder with a polymer melt prior to extrusion of the polymer fibers from which the fabric is made. Such powders may include, for instance, carbon black, silver particles, or even silver- or gold-coated particles. Antistatic fabrics which conduct electricity can also be made by incorporating conductive fibers, e.g., carbon fibers, carbon-filled nylon or polyester fibers, or metal fibers such as stainless steel into yarns used to make such fabrics, or directly woven or knit into the fabric. Electrically or magnetically conductive polymers such as polypyrrole or polyanaline can also be incorporated into textiles so as to provide conductivity. Kuhn et al., U.S. Pat. No. 4,803,096, discloses electrically conductive textile materials made by depositing pre-polymer solutions of polypyrrole or polyanaline onto the textile surface to provide a uniform coating and then treating to complete formation of the polymer.

Electrically conductive textile materials exhibit characteristics which make them suitable for various uses such as antistatic garments, antistatic floor coverings, components in computers, and generally, as replacements for metallic conductors, or semiconductors, including such specific applications as, for example, batteries, photovoltaics, electrostatic dissipation and electromagnetic shielding, for example, as antistatic wrappings of electronic equipment.

Electronic devices, such as computers, may generate electromagnetic waves, which may resonate within their enclosure, to interfere with the electronic device itself, or be emitted through openings in the enclosure, to interfere with other electronic equipment. Such electromagnetic interference (EMI) can be problematic, for example, where electronic devices such as games, laptop computers, and cellular telephones operated by passengers interferes with avionics of commercial aircraft. It is known that certain conductive materials can be used to reduce EMI, e.g., a) rubber which contains conductive fillers, such as metals and carbon in the form of particles and fibers; and b) moldable polyurethane foams provided in the shape of three-dimensional articles, such as cones, which foams are coated with conductive polymer or carbon particles held in place with a suitable binder.

Known conductive materials used to reduce EMI can have significant drawbacks. Rubber articles are heavy and therefore unsuitable for many applications. Carbon or metal impregnated foams while lightweight, are friable and prone to flaking of their conductive coatings. The resulting flakes are electrically conductive and can thus short out equipment. The frangibility of rubbers and foams renders them unsuited for cutting or drilling holes to provide ventilation, equipment ports, or wire openings, inasmuch as such cutting or drilling creates edges which are brittle and crumble easily.

Reflection is enhanced at a boundary where electromagnetic energy passes from a medium of one conductivity into a medium of a different conductivity. Thus, the greater the transition in conductivity from air to the substrate, the more likely electromagnetic waves are reflected, rather than absorbed or transmitted.

The absorption of EMI by a substrate may be increased by providing a substrate with an electrical conductivity gradient in the "z" direction (in terms of three-dimensional Cartesian coordinates), i.e., through its "short" dimension or, more simply, the thickness or depth of the fabric substrate. Consequently, it would be desirable to provide a three-dimensional structure having a conductivity gradient along its thickness, in order to minimize reflection of electromagnetic energy and thereby enhance its absorption and/or transmission.

Pittman et al., U.S. Pat. No. 5,102,727 discloses an electrically conductive textile fabric which has a conductivity gradient, but the gradient is in one or more planar directions of the fabric, i.e., the "x" and "y" directions. The conductivity gradient is obtained by varying conductivity of yarns in the plane of the fabric by varying inherent conductivity of the yarn fibers, relative number of conductive to non-conductive filaments in a yarn, or the extent to which yarns are coated with conductive polymer.

Mammone et al., U.S. Statutory Invention Registration H1,523 discloses a method of making polymer films having a conductivity gradient across its thickness. The method can be used in preparing cast films for metallized or film foil capacitors, providing graded polymer conductivity which slowly decreases as a function of depth.

It would be useful to provide a readily made fabric having a relatively continuous conductivity gradient in its short dimension. It would also be desirable to provide a non-friable, die-cuttable, flame- or fire-resistant treatable, and/or colorable fabric which is capable of reducing EMI emissions by absorbing EMI, especially over many decades of microwave bandwidth.

SUMMARY OF THE INVENTION

The present invention relates to a conductive textile fabric comprising conductive fibers providing a conductivity gradient through its thickness. In one embodiment, the fabric of the invention comprises conductive fibers which are entangled.

The present invention further comprises a fabric which varies through its thickness in a property selected from the group consisting of intrinsic fiber conductivity, susceptibility to fiber coating by conductive materials, fabric density, fiber density, fiber denier, and fiber surface area. The fibers of the fabric of the present invention can be intrinsically conductive and/or can comprise a conductive coating.

The present invention further relates to a method for preparing a conductive textile fabric comprising conductive fibers which provide a conductivity gradient through its thickness which comprises:

a) providing a fabric comprising entangled conductive fibers which fabric varies through its thickness in intrinsic fiber conductivity, or b) providing a fabric comprising entangled conductive and non-conductive fibers in which the percentage of conducting fiber varies through its thickness.

Alternatively, the present invention can relate to a method for preparing a conductive textile fabric comprising conductive fibers which provide a conductivity gradient through its thickness which comprises:

i) providing a fabric comprising entangled non-conductive fibers which fabric varies through its thickness in a property selected from the group consisting of susceptibility to fiber coating by conductive materials, fabric density, fiber density, fiber denier, and fiber surface area; and ii) coating the fibers with a conductive coating selected from the group consisting of conductive polymer, metal coating, and carbon powder coating. This method can further comprise iii) additionally providing over the conductive coating a subsequent coating selected from the group consisting of conductive coating protective coating, flame and/or fire retardant coating, colorant coating and water repellent coating.

In another aspect, the present invention relates to a method for preparing an electromagnetically conductive textile fabric comprising conductive fibers which provide a conductivity gradient through its thickness which comprises:

1) providing a first web comprising entangled non-conductive fibers, said first web having a first density based on surface area of fibers per volume of said first web;

2) providing a second web comprising entangled non-conductive fibers, said second web having a second density based on surface area of fibers per volume of said second web, and said second web optionally comprising fibers which contain low temperature melting polymer;

3) providing an overlay comprising said first and second webs;

4) needlepunching said overlay to provide a unitary fabric, held together by the entanglement of fibers from the first and second web; and optionally heat-setting said unitary fabric;

5) coating the fibers of said first and second webs by contacting the fabric with a solution of conductive polymer precursor;

6) converting said precursor to conductive polymer to provide conductive fibers and a conductive gradient through the thickness of said fabric; and 7) optionally coating said conductive fibers with a flame retardant composition.

In yet another embodiment, the present invention relates to a method for reducing electromagnetic reflection of an electromagnetic radiation reflective surface which comprises covering said surface with an electrically conductive textile fabric comprising conductive fibers providing a conductivity gradient through its thickness.

DESCRIPTION OF THE DRAWINGS

FIG. 1 depicts a perspective exploded view drawing of the fabric composition of Example 1 showing the relative arrangement of two major web components of different density and a scrim component making up the fabric, prior to joining of the webs.

FIG. 2 depicts a perspective view drawing of the fabric composition of Example 2 after joining the webs and coating with a conductive polymer. Variation in conductivity through the thickness of the fabric is shown as associated with the density of the major web components.

FIG. 3 depicts a perspective exploded view drawing of the fabric composition of Example 3 showing the relative arrangement of two web components of similar density but varying conducting fiber content.

FIG. 4 depicts a perspective view drawing of the fabric composition of Example 3 after joining the webs. Variation in conductivity through the thickness of the fabric is shown as associated with the conducting fiber content of the web components.

FIG. 5 depicts the reflection loss (dB) in reflection from a metal plate for the microwave absorbing felt fabric of the present invention having an electrical conductivity gradient, over a range from 5 GHz to 14 GHz, positioned in one instance with the lesser conducting surface towards the emitting antenna.

FIG. 6 depicts the reflection loss (dB) in reflection from a metal plate for the microwave absorbing felt fabric of the present invention having an electrical conductivity gradient, over a range from 5 GHz to 14 GHz, positioned in one instance with the lesser conducting surface towards the emitting antenna and in another instance with the greater conducting surface towards the emitting antenna.

FIG. 7 depicts emissions (dB) from an electronic enclosure measured in an anechoic chamber over a range of 0.0 GHz to 3.0 GHz both with and without the fabric of the invention placed on the inner surface of an electronics enclosure.

DETAILED DESCRIPTION OF THE INVENTION

Without limiting the scope of the invention, the preferred embodiments and features are hereinafter set forth. Unless otherwise indicated, all parts and percentages are by weight and conditions are ambient, i.e. one atmosphere of pressure and 25° C.

The present invention relates to an electromagnetically conductive fabric comprising entangled, conductive fibers and preferably having a gradual conductivity gradient through its thickness, i.e., through its shortest dimension, or, in terms of Cartesian coordinates, in the "z" direction—along the axis perpendicular to the plane of the fabric. While not wishing to be bound by theory, it is believed that the relatively loose construction of a fabric comprising entangled fibers, such as felt, and the gradual transition in conductivity provided by entangled fibers in the "z" direction is conducive to electromagnetic wave absorption.

For purposes of the present invention, an entangled fiber is one which is irregularly or randomly interwoven with other fibers to form a fabric. This contrasts with a fiber which is arranged in relation to other fibers as part of a regular framework such as in woven or knitted fabrics containing spun fibers. The fabric can be a felt material of unitary construction, held together by the entanglement of its fibers. The felt material can be a nonwoven sheet of entangled fibers, which can be made by a combination of mechanical and chemical action, pressure, moisture and heat as is well known in the art. However, the present invention relates not only to felt fabrics, but also woven fabrics treated to provide entanglable conductive fibers, and knitted fabrics treated to provide entanglable conductive fibers. Such treatments are known in the art and can include such processes as needling, needlepunching and carding.

The resulting surfaces of such treated fabrics have entanglable fibers which may become entangled with adjacent felt fabric surfaces, or other needled woven or knitted fabric surfaces, to form composite materials. For example, a woven or knitted fabric can be needled to create fiber entanglement perpendicular to the plane of the fabric by needlepunching together with a second, nonwoven sheet or fabric. Similarly, two or more adjacent felt fabric surfaces may be subjected to entangling of their fibers to form a composite material. Such construction wherein adjoining fabric surfaces are of differing electrical conductivities, provides an interface of intermediate conductivity which desirably smooths or "blurs" an electric field gradient applied across the fabric composite thickness. In other words, the resulting fabric can comprise two or more superimposed webs of different electrical conductivities whose adjoining surfaces provide transition regions comprising entangled conductive fibers from each web associated with the adjoining surfaces. The transition regions exhibit electrical conductivities which are intermediate to that of the adjoining webs, which serves to more gradually transition conductivity through the resulting fabric's thickness.

For present purposes, conductivity can be described as the degree to which a material interacts either electrically or magnetically with electromagnetic radiation. Material such as ferrites are considered conductive in terms of the present invention.

The fabric of the present invention comprises conductive fibers. The fibers may be intrinsically conductive, e.g., containing carbon, ferrite, and/or metal, preferably held with a binder or melt-fused to the fiber surface. Fibers, including intrinsically non-conductive, partially-conductive and/or semi-conductive fibers can be coated with a conductive polymer which improves fiber conductivity. Conductive coating techniques suited to use in the present invention are well known in the art and include those disclosed by Kuhn et al., U.S. Pat. Nos. 4,803,096, 4,877,646, 4,975,317, 4,981,718, and 5,108,829 and by Child, U.S. Pat. No. 5,833,884. Such techniques can provide conducting coatings of polypyrrole, polyaniline, or substituted derivatives thereof. The fibers may be coated prior to their incorporation in the fabric; however, it is preferred that the fibers be coated after the fabric structure is formed.

The fibers may have virtually any denier; preferably they range in denier from 1 to 1000, more preferably from 6 to 25. The fibers provided in the fabric of the present invention can also include those selected from the group consisting of nonconductive fibers, thermoplastic fibers, sheath and core fibers, yarns, and staple fibers, preferably provided as staple fibers. The fibers of the present invention can also include those selected from the group consisting of natural and synthetic fibers and blends thereof, including silk fibers, wool fibers, cotton fibers, polyester fibers, polyamide fibers, polyolefin fibers, polyurethane fibers, and acrylic fibers and high modulus inorganic fibers, such as glass, quartz and ceramic fibers.

The fibers of the fabric of the present invention can be formed into a fabric having a conductivity gradient through its thickness by any of a number of methods. In one aspect of the invention, conductivity gradient is achieved by provided by fibers having increasing intrinsic conductivity through the fabric thickness. In another aspect of the invention, the conductivity gradient is provided by fibers having increased susceptibility to coating by a conductor through the fabric thickness.

Assuming the conductive coating coats all fiber surfaces evenly, susceptibility to coating for purposes of creating a conductivity gradient is dependent on surface area of all fibers at a particular thickness in the fabric. Accordingly, the ultimate conductivity of coated conductive fibers can be affected by such properties as fabric density, fiber density, fiber denier, and fiber surface area, particularly by increasing fiber surface area per unit volume of fabric. These properties are generally related in direct proportion to conductivity, except for denier. Conductivity is related inversely proportional to the square root of the fiber denier. As a result of these relationships, it has now been found possible in one aspect of the invention to provide a fabric material having a conductive gradient through its thickness by preparing a precursor fabric comprising relatively non-conducting fibers which provide a gradient for such properties along the fabric thickness, and thereafter coating the fibers of the precursor fabric with a conductor material.

Coatings not related to promoting conductivity can also be added to the fabric or fibers of the present invention, and are generally added after the conductivity promoting coating, if such is present. Such coatings are generally known in the prior art and include protective and/or fire and flame retarding coatings such as polyvinylchloride (PVC), or poly(vinylidene chloride) (PVdC), colorant coatings, and water repellent coatings.

The fabrics prepared in accordance with the present invention can have a thickness ranging from 40 mils to 4 inches, preferably from 100 mils to 1 inch. Such fabrics can also exhibit a transmission loss through the fabric of greater than 5 dB at 9 GHz, preferably greater than 12 dB at 9 GHz, where dB loss=20 log $(V_W/V_O)$, where $V_W$ is the electric field intensity measured through the fabric and $V_O$ is the electric field intensity measured without the fabric. For reducing EMI from electronic enclosures, fabrics exhibiting transmission losses of greater than 15 dB at 9 GHz are preferred, most preferably greater than 20 dB at 9 GHz.

Particularly effective fabrics of the present invention for absorbing electromagnetic radiation measure a difference in reflection of electromagnetic radiation of greater than 1 dB at 9 GHz between the fabric measured with the fabric surface of lower conductivity facing a source of said radiation and the fabric measured with the fabric surface of higher conductivity facing a source of said radiation. Alternatively, the present invention can provide a fabric wherein the conductivity varies from the inner ¼ of fabric thickness of higher conductivity to the outer ¼ of fabric thickness of lower conductivity by a factor of at least 1.5:1, preferably at least 4:1.

The fabric of the present invention can be used in various applications which take advantage of the conductivity gradient through its depth. Such applications include use as electromagnetic interference shields for computers and other sensitive instruments, when placed on the inner surface of the instrument enclosure. The fabric of the present invention can also be used to reduce cavity resonation of electromagnetic waves inside the enclosures of electronic devices when the felt is placed inside. The present fabric can also be used as a microwave absorber, as well as for lining anechoic chambers.

For the foregoing applications, the size, conductivity and placement of the fabric of the present invention should be determined experimentally, inasmuch as the frequency of emissions, layout, size and materials of construction will vary greatly from one device to the other.

All of the U.S. patents disclosed in this specification are incorporated herein by reference in their entirety.

The invention may be further understood by reference to the following examples, but is not intended to be unduly limited thereby.

EXAMPLE 1

Three inch PET fibers of 6 denier having a round cross-section as were formed into a web and needlepunched on a Fehrer needlepunch loom to form a first nonwoven fabric 10 as depicted in FIG. 1, having a thickness of 100 mils and a weight of 22 ounces per square yard (22 ounces per total volume of each square yard of fabric). A Raschel knit scrim of polyester 20 (1.5 ounces per square yard) was joined to the first web by needlepunching, the first web and scrim being fed to the needlepunch loom together. The scrim was used to stabilize the first web.

A second web 30 was prepared having two different fibers, the first being a polyester of 25 denier, 3" staple (80% by weight) and the second being a nylon of 6 denier, 3" staple, having a core and sheath, wherein the sheath was a low-melt nylon (20% by weight). The second web had a thickness of 100 mils and a weight of 12 ounces per square yard (12 ounces per total volume of each square yard of fabric).

The two webs were overlaid and needlepunched together and squashed down to 180 mils to create a unitary construction, held together by the entanglement of fibers from the first and second webs. The resulting composite was heat set to preserve loft and melt the sheath of the nylon fiber, to bind the fibers and provide a felt fabric.

EXAMPLE 2

A sample of felt fabric of Example 1 weighing 93 pounds was coated with a conductive polymer by introduction into a bath at ambient temperature containing 24 pounds of a 39% aqueous ferric chloride solution, 2.7 pounds of the sodium salt of anthraquinone sulfonic acid, 1.7 pounds of pyrrole and 168 gallons of water, following the general procedures of U.S. Pat. No. 4,803,096. The felt-bath mixture was agitated for three hours and the fabric was rinsed to remove residual liquor. After drying, the web was tested as in Example 4.

FIG. 2 depicts a perspective view drawing of the fabric composition of Example 2 after joining the webs and coating with a conductive polymer. Variation in conductivity through the thickness of the fabric is shown which includes high conductivity zone 40, intermediate conductivity zone 50 depicted between the dashed lines and low conductivity zone 60 which are associated with the density of the major web components of the fabric precursor. The intermediate conductivity of zone 50 is provided by the entagled fibers of both zones 40 and 60.

Post Treatment—A subsequent coating was added to the coated fibers of the above web as follows: A mixture of 100 pounds of a poly(vinylidene chloride) latex containing 40% solids from Zenaca Resins of Wilmington, Mass., 200 pounds of an antimony pentoxide suspension containing 60% solids from Nyacol Products, PQ Corporation, Valley Forge, Pa., and 50 pounds of water was saturated into the web sample. The excess chemical was removed by nipping the web at a pressure of 50 psi. The web was then dried resulting in a protective, flame-retardant film coating the surface of the fibers.

EXAMPLE 3

Example 1 is repeated except that both the first and second webs are of the same density and construction as Example 1's first web, but contain intrinsically conductive stainless steel fibers in differing concentrations. The resulting fabric has a conductivity gradient which is attributable to the differing concentrations of stainless steel fibers in each web.

FIG. 3 depicts a perspective exploded view drawing of the fabric composition of Example 3 showing the relative arrangement of web components of similar density but varying conducting stainless steel fiber content. Web 70 has a higher conducting stainless steel fiber content than web 80. The resulting fabric resulting from needlepunching the two webs is depicted in FIG. 4 which has high conductivity zone 100, intermediate zone 110, and low conductivity zone 120. Intermediate conductivity of zone 110 is attributed to the entangling stainless steel fibers of both high and low conductivity zones.

EXAMPLE 4

Electromagnetic waves impinging a substrate will result in:

% reflection+% absorption+% transmission=100%. This Example demonstrates the decrease in reflectance of microwaves measured first from a metal plate (perfect reflector), and then the metal plate covered by the fabric of Example 2 having a conductivity gradient in accordance with the present invention. The difference in reflected energy gives the reflection loss and the data are shown in FIG. 5 which depicts reflection loss in dB versus radiation frequency (GHz) ranging from 5 GHz to about 14 GHz. The incident microwave was plane polarized and every measurement was taken twice-once with the polarization in the machine direction of the material, and once with it in the cross machine direction. The results from each orientation were then averaged.

EXAMPLE 5

This Example demonstrates the importance of a conductivity gradient in reducing microwave reflection. Reflection was compared following the procedure of Example 4, between the fabric with the gradient positioned with the side having less conductivity facing outward, and the fabric positioned with the gradient reversed. FIG. 6 shows the reflection loss in dB. As expected, the "front" configuration (lesser conducting surface towards the emitting antenna) reflects less energy back to the receiver and hence has a higher loss than the "back" configuration (greater conducting surface towards the antenna). Since the transmission is the same for both configurations, the "front" configuration must absorb more energy.

EXAMPLE 6

Emissions (dB) from an electronic enclosure were measured in an anechoic chamber over a range of 0.0 GHz to 3.0 GHz both with and without the fabric of Example 2 placed on the inner surface of a box approximating the dimensions of a desktop computer case. The results which are depicted graphically in FIG. 7 show that the fabric of Example 2 significantly reduces electronic emissions when placed on the inside surface of the enclosure.

There are of course, many alternate embodiments and modifications of the invention which are intended to be included within the scope of the following claims.

It is claimed:

1. An electromagnetically conductive textile fabric comprising conductive fibers creating a conductivity gradient through the thickness of the fabric, wherein the fabric is selected from the group consisting of woven, knitted and nonwoven fabrics, provided that if the textile fabric is a woven fabric, the woven fabric comprises two or more superimposed webs, and wherein the gradient is produced by a variation selected from the group consisting of:

(a) intrinsically conductive fibers, wherein the concentration of the conductive fibers varies through the thickness of the fabric;

(b) first and second intrinsically conductive fibers having different conductivities, wherein the relative concentration of the first and second fibers varies through the thickness of the fabric;

(c) non-conductive fibers that are coated with a conductive coating, wherein the fiber surface area per unit of volume varies through the thickness of the fabric;

(d) first non-conductive fibers that are coated with a conductive coating and second non-conductive fibers, wherein the first and second fibers have different susceptibilities to being coated by a conductive coating and have different conductivities, and wherein the relative concentration of the first and second varies through the thickness of the fabric; and (e) first non-conductive fibers that are uniformly coated with a conductive coating, and second fibers having a different conductivity from the first fibers, wherein the first fibers are entangled with the second fibers by needling, and wherein the relative concentration of the first and second fibers varies through the thickness of the fabric.

2. The fabric of claim 1 which is selected from the group consisting of felt fabrics, woven fabrics treated to provide entanglable conductive fibers, and knitted fabrics treated to provide entanglable conductive fibers.

3. The fabric of claim 1 which comprises two or more superimposed webs of different conductivities whose adjoining surfaces provide transition regions comprising entangled conductive fibers from each web associated with said adjoining surfaces, said regions having conductivities intermediate that of the adjoining webs.

4. The fabric of claim 3 wherein said webs are selected from the group consisting of felt fabrics.

5. The fabric of claim 3 wherein said webs are selected from the group consisting of woven fabrics and knitted fabrics, which are treated to provide entanglable conductive fibers.

6. The fabric of claim 1 wherein said fibers are intrinsically conductive.

7. The fabric of claim 6 wherein said intrinsically conductive fibers contain a conductor selected from the group consisting of carbon, ferrite, and metal.

8. The fabric of claim 1 wherein said fibers comprise a conductive coating.

9. The fabric of claim 8 wherein said conductive coating is selected from the group consisting of conductive polymer, metal coating, and carbon powder coating.

10. The fabric of claim 8 wherein said conductive coating is a conductive polymer is selected from the group consisting of polypyrrole, polyanaline and derivatives thereof.

11. The fabric of claim 8 which further comprises an additional coating over said conductive coating selected from the group consisting of conductive coating protective coating, fire retardant coating, colorant coating and water repellent coating.

12. The fabric of claim 1 which comprises a plurality of superimposed webs of different conductivities which webs are needlepunched to form a unitary construction.

13. The fabric of claim 1 which comprises a plurality of superimposed webs of different densities which webs are needlepunched to form a unitary construction.

14. The fabric of claim 1 wherein said fabric has a thickness ranging from 40 mils to 4 inches.

15. The fabric of claim 1 wherein said fabric has a thickness ranging from 100 mils to 1 inch.

16. The fabric of claim 1 which has a transmission loss through the fabric of greater than 5 dB at 9 GHz, where dB loss=20 log $(V_W/V_O)$, where $V_W$ is the electric field intensity measured through the fabric and $V_O$ is the electric field intensity measured without the fabric.

17. The fabric of claim 1 which has a transmission loss through the fabric of greater than 15 dB at 9 GHz, where dB loss=20 log $(V_W/V_O)$, where $V_W$ is the electric field intensity measured through the fabric and $V_O$ is the electric field intensity measured without the fabric.

18. The fabric of claim 1 which has a difference in reflection of electromagnetic radiation of greater than 1 dB at 9 GHz between the fabric measured with the fabric surface of lower conductivity facing a source of said radiation and the fabric measured with the fabric surface of higher conductivity facing a source of said radiation.

19. The fabric of claim 1 wherein the conductivity varies from the inner ¼ of fabric thickness of higher conductivity to the outer ¼ of fabric thickness of lower conductivity by a factor of at least 1.5:1.

20. The fabric of claim 1 wherein the conductivity varies from the inner ¼ of fabric thickness of higher conductivity to the outer ¼ of fabric thickness of lower conductivity by a factor of at least 4:1.

21. The fabric of claim 1 wherein said fibers are selected from the group consisting of silk fibers, wool fibers, cotton fibers, polyester fibers, nylon fibers and acrylic fibers.

22. The textile fabric of claim 1, wherein the conductivity gradient is produced by intrinsically conductive fibers, wherein the concentration of the conductive fibers varies through the thickness of the fabric.

23. The textile fabric of claim 1, wherein the conductivity gradient is produced by first and second intrinsically conductive fibers having different conductivities, wherein the relative concentration of the first and second fibers varies through the thickness of the fabric.

24. The textile fabric of claim 1, wherein the conductivity gradient is produced by non-conductive fibers that are coated with a conductive coating, wherein the fiber surface area per unit of volume varies though the thickness of the fabric.

25. The textile fabric of claim 1, wherein the conductivity gradient is produced by first non-conductive fibers that are coated with a conductive coating and second non-conductive fibers, wherein the first and second fibers have different susceptibilities to being coated by a conductive coating and have different conductivities, and wherein the relative concentration of the first and second fibers varies through the thickness of the fabric.

26. The textile fabric of claim 1, wherein the conductivity gradient is produced by first non-conductive fibers that are uniformly coated with a conductive coating, and second fibers having a different conductivity from the first fibers, wherein the first fibers are entangled with the second fibers by needling, and wherein the relative concentration of the first and second fibers varies through the thickness of the fabric.

\* \* \* \* \*